(12) United States Patent
Mukai et al.

(10) Patent No.: US 7,876,987 B2
(45) Date of Patent: Jan. 25, 2011

(54) OPTICAL DEVICE AND EXPOSURE APPARATUS

(75) Inventors: Atsushi Mukai, Ashigarakami-gun (JP);
Shinichiro Sonoda, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 251 days.

(21) Appl. No.: 12/112,474

(22) Filed: Apr. 30, 2008

(65) Prior Publication Data

US 2009/0323175 A1   Dec. 31, 2009

(30) Foreign Application Priority Data

May 1, 2007   (JP) ............... 2007-121102

(51) Int. Cl.
*G02B 6/26* (2006.01)
(52) U.S. Cl. .................. 385/38; 385/33; 385/50
(58) Field of Classification Search ............ 385/31, 385/33, 34, 38
See application file for complete search history.

(56) References Cited

U.S. PATENT DOCUMENTS 4,483,585 A * 11/1984 Takami .................. 385/115

7,141,927 B2 * 11/2006 Manning .................... 313/573

FOREIGN PATENT DOCUMENTS

| JP | 05-288967 | 11/1993 |
| JP | 2006-286866 A | 10/2006 |
| JP | 2007-025431 A | 2/2007 |
| WO | 2004/068230 A1 | 8/2004 |

OTHER PUBLICATIONS

Dijon et al, "High damage threshold fluoride UV mirrors made by Ion beam sputtering," Proc. SPIE, vol. 3244, 406, pp. 406-416 and abstract, 1998.

* cited by examiner

*Primary Examiner*—Sarah Hahm
(74) *Attorney, Agent, or Firm*—Sughrue Mion, PLLC

(57) ABSTRACT

The present invention provides an optical device and an exposure apparatus capable of suppressing a reduction in light output. The optical device of the present invention includes a laser light source which emits laser light having a short wavelength (e.g., 160 to 500 nm), a lens, a transparent member and an optical fiber provided with a junction-inhibiting film. The optical device is configured such that light density of abutment faces between the transparent member and the optical fiber formed with the junction-inhibiting film is 4464 W/mm² or less, thereby suppressing a reduction in light output which may be caused by fusion.

27 Claims, 6 Drawing Sheets

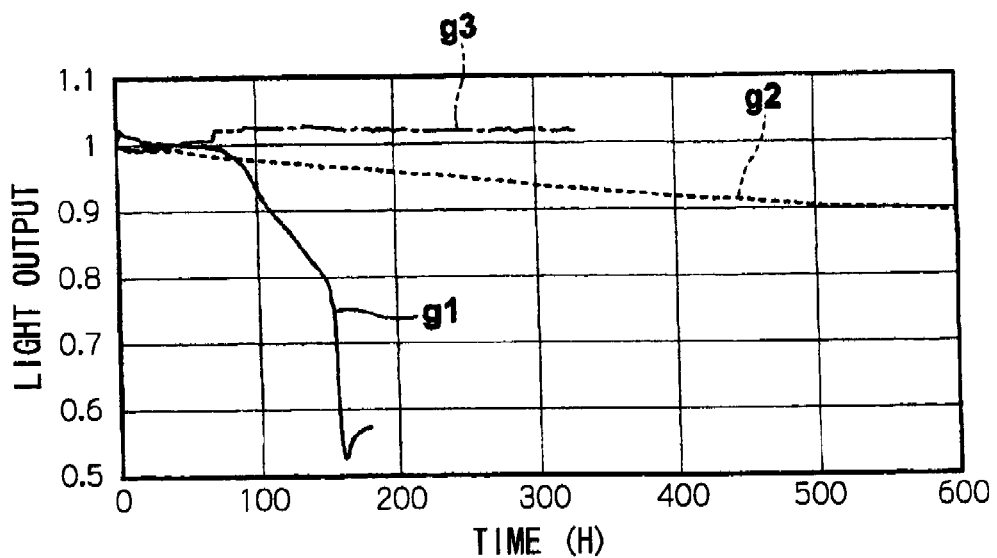
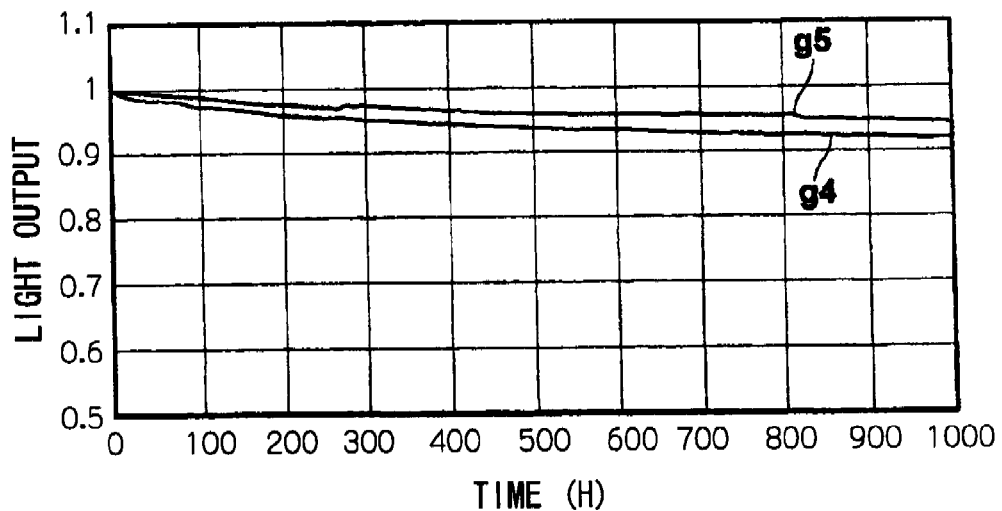

OPTICAL DEVICE AND EXPOSURE APPARATUS

CROSS-REFERENCE TO RELATED APPLICATION

This application claims priority under 35 USC 119 from Japanese Patent Application No. 2007-121102 filed on May 1, 2007, the disclosures of which is incorporated by references herein.

BACKGROUND

1. Technical Field

The present invention relates to an optical device and an exposure apparatus, and more particularly, to an optical device and an exposure apparatus which connect optical members such as optical fiber and transparent member to each other to propagate light such as laser light.

2. Related Art

As a conventional optical device which connects optical members such as optical fiber and transparent members with each other to propagate laser light, International Patent Application Laid-open No. WO2004/68230 discloses a technique in which a coreless fiber is connected to an output terminal of fiber by fusion splice, and a length of a light path is set such that output beams are not vignetted by coreless fiber end. Especially when the coreless fiber length is set to 1 mm or less, vignetting is reduced.

Japanese Patent Application Laid-open (JP-A) No. 5-288967 discloses a device in which a light-introduction rod having the same refractive index as that of a core of optical fiber and having the same outer diameter as that of the optical fiber is integrally formed on an input terminal face of the optical fiber by heating fusion.

JP-A No. 2007-25431 discloses a pigtail type laser module in which light power density in a fiber incident terminal face or output terminal face exposed to air is 15 W/mm$^2$ or less or 60 to 800 W/mm$^2$.

JP-A No. 2006-286866 discloses a receptacle type laser module in which a transparent member is brought into contact with a fiber incident terminal face to collect semiconductor laser light from the transparent member and the light is introduced into the optical fiber, and light density on the incident side of the transparent member is 10 W/mm$^2$ or less.

However, when the technique described in International Patent Application Laid-open No. WO2004/68230 is used in an incident portion of the pigtail type laser module, there is a problem that if light output is high, coreless fiber end is contaminated in some cases and its lifetime is reduced. When the technique is used for a receptacle type laser module, on the other hand, the optical fiber is abutted against a transparent member such as a stab, thereby positioning the fiber end in the beam propagating direction. However, when the light output is high, fusion occurs between the coreless fiber and the stab while laser light is on. In this case, there was a problem that the fused portion is easily peeled off by vibration or the like, and connection loss to the optical fiber is increased.

According to the technique described in JP-A No. 5-288967, like the technique of International Patent Application Laid-open No. 2004/68230, if the light output is high when the technique is used for the receptacle type laser module, there is a problem that the fusion occurs and the connection loss to the optical fiber is increased. When the incident light output is high, there was another problem that the fiber terminal face is contaminated.

According to the technique described in JP-A No. 2007-25431, in a fiber incident terminal face or output terminal face, if the light density exceeds 15 W/mm$^2$, contamination may not be prevented however, there was a problem that since the core diameter of the fiber incident terminal is determined, the upper limit of the light output is determined by the fiber diameter and thus, it is impossible to make the light output be considerably high.

According to the technique described in JP-A No. 2006-286866, like the technique of International Patent Application Laid-open No. 2004/68230, there was a problem that the fusion occurs and the connection loss to the optical fiber was increased.

When a light source of short wavelength such as 405 nm is used, it is known that contamination is generated in fiber end, light output is reduced and film quality is deteriorated. It is known that especially when the light output density becomes high, a surface of a transparent member such as a glass that is in contact with air is contaminated and output is largely lowered.

To suppress the reduction in light output caused by such contamination, it is conceived to lower the light output density however, in the conventional technique, it is unclear as to how much the light output density should be lowered to suppress the reduction in light output caused by contamination.

When high output light enters in the structure in which the transparent member is connected to the fiber end as mentioned above, it is possible that fusion of glasses occurs on both terminal faces. However, if fusion occurs, there is a possibility that they are peeled off even with slight vibration applied to the optical fiber, and there is a problem that transmission loss is increased due to light scattering caused by unevenness on the peeled surface, and the reliability is deteriorated.

SUMMARY

The present invention provides an optical device and an exposure apparatus capable of suppressing reduction of light output.

According to an exemplary embodiment of the present invention, there is provided an optical device comprising a light source which outputs light of predetermined wavelength, a first optical member through which the light of the predetermined wavelength passes, and a second optical member which abuts against the first optical member and through which the light of the predetermined wavelength passes, wherein the wavelength is in a range of approximately 160 to 500 nm, a junction-inhibiting film is provided on an abutment face between the first optical member and the second optical member, and light density in the abutment face is approximately 4464 W/mm$^2$ or less.

BRIEF DESCRIPTION OF THE DRAWING

Exemplary Embodiments of the present invention will be described in detailed based on the following figures, wherein:

FIG. 7 is a graph showing variation with time of light output of output light when $MgF_2$ films respectively having film thicknesses of $\lambda/2$, $\lambda/4$ and $\lambda/6$ were respectively formed by vapor deposition.

FIG. 8 is a graph showing variation with time of light output of output light when $MgF_2$ films having film thickness of $\lambda/6$ were respectively formed by a vapor deposition method and an ion assist method.

DETAILED DESCRIPTION

Exemplary embodiments of the present invention will be explained with reference to the drawings.

First Exemplary Embodiment

Figure 1:
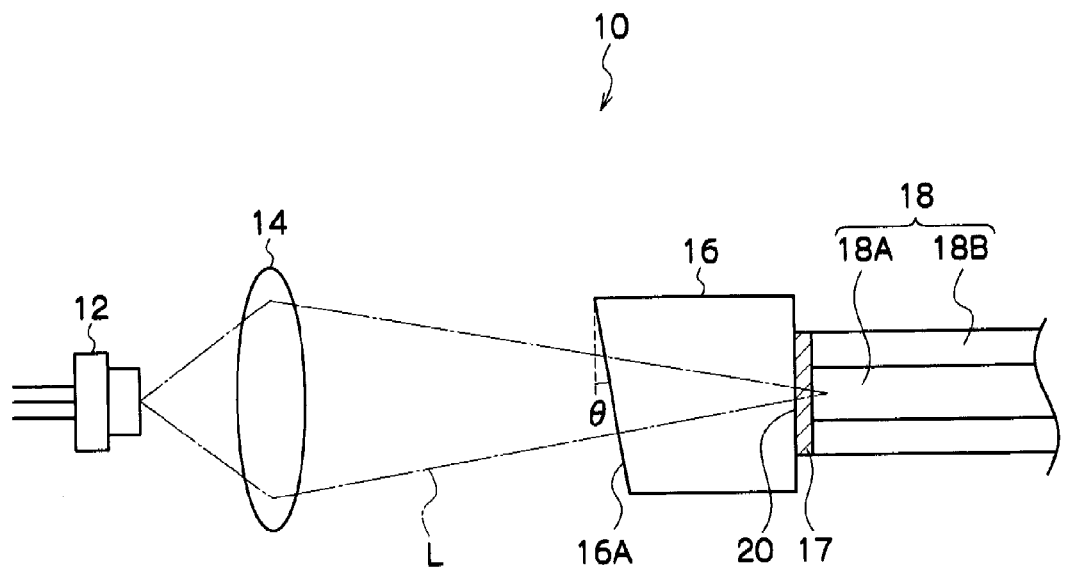
FIG. 1 is a schematic diagram of an optical device according to a first exemplary embodiment.

FIG. 1 schematically shows a structure of an optical device 10 according to the exemplary embodiment. As shown in FIG. 1, the optical device 10 includes a laser light source 12, a lens 14 as a condensed optical system, a transparent member 16, and an optical fiber 18 formed at its terminal face with a junction-inhibiting film 17.

The laser light source 12 includes a semiconductor laser, and outputs laser light having a short wavelength (e.g., 160 nm to 500 nm). A wavelength of less than 160 nm is viable in practice when the light absorption of the transparent member 16 is taken into consideration. With wavelengths exceeding 500 nm, it is not possible to achieve oscillation if gallium nitride or the like is used as a constituent material of the laser light source 12. Therefore, in this exemplary embodiment, a short wavelength region is defined as one being in a range of 160 nm to 500 nm.

The lens 14 condenses laser light L which is output from the laser light source 12 near abutment faces between the transparent member 16 and the optical fiber 18 with predetermined magnification (e.g., four times). It is preferable that a condensed position of the laser light L is deviated from the abutment face in the main axial direction of the laser light L and within the optical fiber 18 or within the transparent member 16. With this, light density of the abutment face may be lowered.

The transparent member 16 is made of glass material such as quartz, and the transparent member 16 is optically contacted with the optical fiber 18. The optical fiber 18 has a core 18A surrounded by a clad 18B. The transparent member 16 has an outer diameter greater than a beam diameter of the laser light L which passes through the transparent member 16 so that the laser light L is not vignetted.

The transparent member 16 is diagonally cut so that its incident terminal face 16A forms an angle θ with respect to a direction perpendicular to the main axial direction of the laser light L. Thereby, light returning toward the laser light source 12 may be reduced, and a coupling coefficient with respect to the optical fiber 18 may also be enhanced. The transparent member 16 does not have to be cut diagonally, and the incident terminal face 16A may be coated with AR, thus reducing returning light.

A junction-inhibiting film 17 is formed on a terminal face of the optical fiber 18 on the side of the abutment face with respect to the transparent member 16. It is preferable that the material of the junction-inhibiting film 17 has high transparency in a short wavelength region (160 nm to 500 nm) and includes fluoride ($YF_3$, LiF, $MgF_2$, NaF, $LaF_3$, $BaF_2$, $CaF_2$ and $AlF_3$).

It is known that when laser light having wavelength of 370 nm to 500 nm passes through a transparent member (glass stab) made of quartz glass, incident and output ends of the transparent member are contaminated in accordance with the light density and contaminant which deteriorates transmittancy adheres. As a result of keen examination, the inventor found that there was a linear correlation between the degree of output reduction and light density. This will be explained below.

The inventor condensed light using a lens such that output light of laser driven at 50 mW to 400 mW became a predetermined power density, disposed a transparent member made of a glass member at a condensing point, moved the transparent member along the main axis of the laser light, and measured the variation in transmittancy of the laser light over time, while changing the light density.

Figure 2:
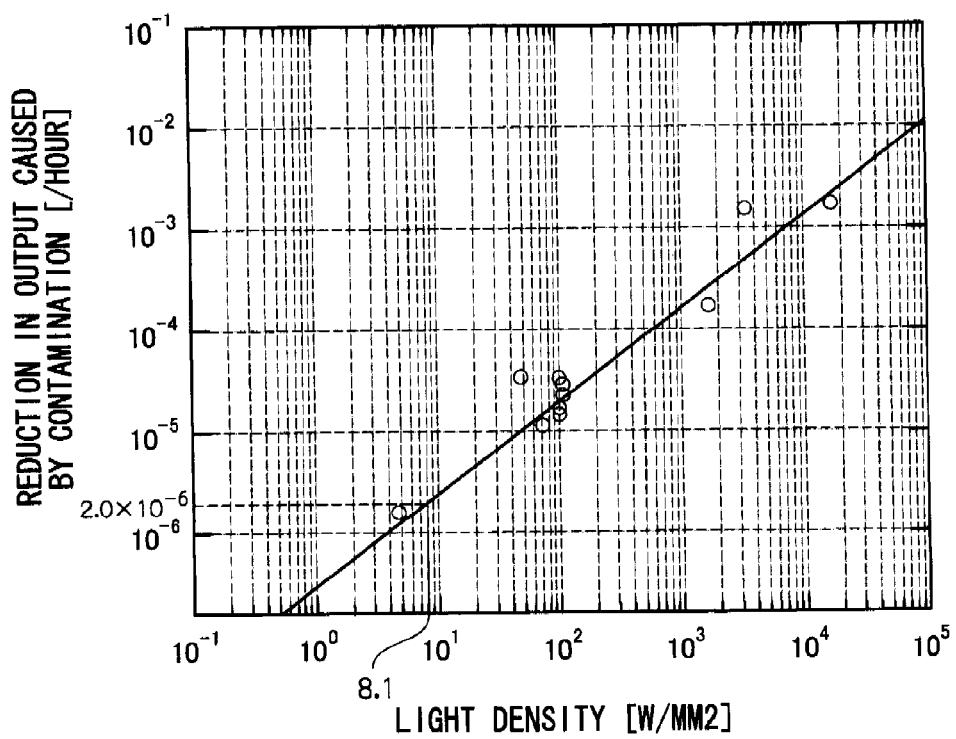
FIG. 2 is a graph showing a relation between light density and reduction of light output caused by contamination.

FIG. 2 shows a result thereof. A lateral axis shows light density (W/mm²) in the incident terminal face of the laser light of the transparent member, and a vertical axis shows a degree of light output reduction caused by contamination, i.e., a degree of transmittancy reduction per time of light passing through the transparent member. The vertical axis shows the transmittancy reduction. In FIG. 2, marks ○ show actual measuring points, and the straight line shows a line on which each measuring point is obtained by least square. A formula expressing the straight line is as follows:

$$\text{Log } R = -6.5 + 0.9 \times \text{Log}(P/S) \quad (1)$$

wherein, R represents a degree of transmittancy reduction per time, P represents an output value (W) of laser light, and S represents a beam area (mm²) in an incident terminal face of the transparent member.

For example, a lifetime of the laser light source may be defined as the time until the transmittancy of laser light has decreased by 20% from a predetermined transmittancy. A goal is then set to suppress the decrease in output due to contamination to $1/10$ or less, i.e., to 2% or less of the decrease in transmittancy over the lifetime of the laser light source, using a laser having a lifetime of 10000 ($10^4$) hours. In this case the reduction amount is $0.02/10^4 = 2.0 \times 10^{-6}$. The light density corresponding to this value is 8 W/mm², according to FIG. 2.

Therefore, in the structure shown in FIG. 1, if the light density in the incident terminal face 16A of the transparent member 16 is set to 8 W/mm² or less, the reduction in light output caused by contamination may be suppressed. More specifically, an output value of the laser light source 12, magnification of the lens 14, the length of the laser light of the transparent member 16 in the main axial direction, a refractive index of the transparent member 16 and the like are set such that the light density of the incident terminal face 16A of the transparent member 16 becomes 8 W/mm² or less.

If the optically contacted abutment faces of the transparent member (glass stab) made of quartz glass and optical fiber made of quartz are irradiated with laser light having wavelength of 370 nm to 500 nm, the abutment faces are fused in some cases. The fused portion is prone to be peeled off with slight vibration. If the fused portion is peeled off, transmittancy loss is abruptly increased by light dispersion caused by unevenness of its surface, and this causes accidental deficiency.

As a result of keen examination, the present inventor found that the accidental failure ratio was largely improved by junction-inhibiting films 17 including fluoride such as $MgF_2$ and $YF_3$ on abutment faces of the optical fiber 18 and the transparent member 16. The inventor measured a relation between the accidental failure ratio when the junction-inhibiting film made of $MgF_2$ was formed on the terminal face of the optical fiber 18 that abuts against the transparent member 16 and light density of the abutment faces between the transparent member and the optical fiber, and obtained a result as shown in FIG. 3.

Figure 3:
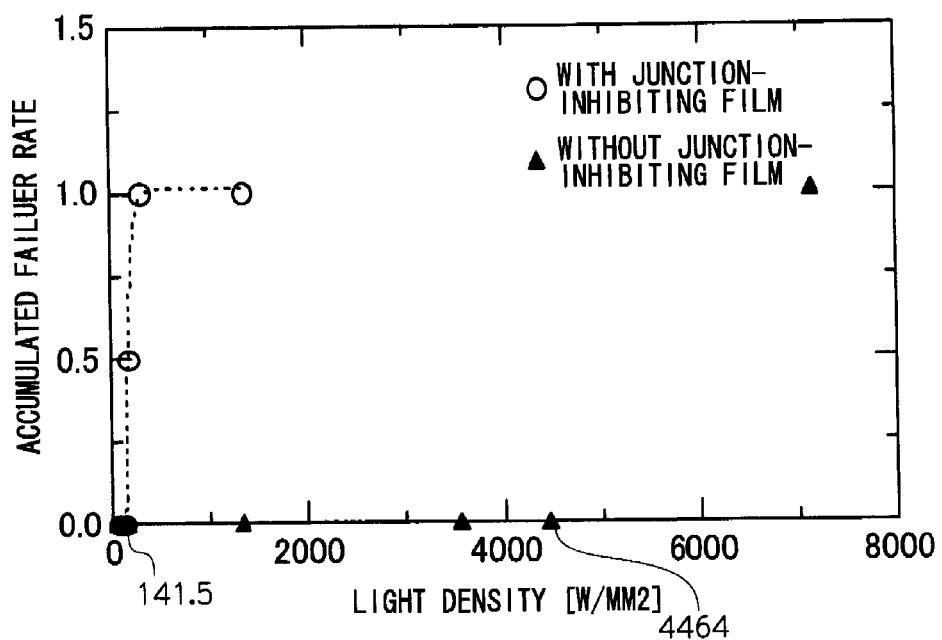
FIG. 3 is a graph showing a relation between light density and an accidental failure ratio.

As shown in FIG. 3, it was found that the accidental deficiency is not generated if the light density of the abutment face was 4464 $W/mm^2$ or less. Therefore, in the structure shown in FIG. 1, if the light density of the abutment faces 20 between the transparent member 16 and the optical fiber 18 formed with the junction-inhibiting film 17 is set to 4464 $W/mm^2$ or less, for example, the reduction of light output caused by fusion may be suppressed. More specifically, an output value of the laser light source 12, magnification of the lens 14, the length of the laser light of the transparent member 16 in the main axial direction, an refractive index of the transparent member 16 and the like are set such that the light density of the abutment faces 20 between the transparent member 16 and the optical fiber 18 formed with the junction-inhibiting film 17 becomes 4464 $W/mm^2$ or less. It was found that when the junction-inhibiting film 17 was not provided, if the light density of the abutment face was 140 $W/mm^2$ or less, an accidental deficiency was not generated.

Here, the accidental deficiency means, for example, when, in a time-variation test, while monitoring output values of laser light passing through the transparent member and the optical fiber, the light output when ACC (Auto Current Control) drive is carried out varies abruptly and becomes 0.8 times or less that of a normal state, or when a drive current of a laser light source when APC (Auto Power Control) drive is carried out varies abruptly and the current becomes 1.2 times or more of a drive current in a normal state, and when the variation cannot be predicted from variations in light output or drive current before the abrupt variation occurs.

From the above, define that a beam area in the incident terminal face 16A of the transparent member 16 exposed to air is defined as S1 [$mm^2$] and a beam area in the abutment faces 20 between the transparent member 16 and the optical fiber 18 formed with the junction-inhibiting film 17 is defined as S2 [$mm^2$]. If the light output P in the optical device 10 satisfies the following formulas, the reduction in light output caused by contamination or fusion may be suppressed.

$$P[W] \leq 8 W/mm^2 \times S1[mm^2] \quad (2)$$

$$P[W] \leq 4464 W/mm^2 \times S2[mm^2] \quad (3)$$

If P is set such that both the formulas (2) and (3) are satisfied, the reduction in light output caused by contamination and fusion may be suppressed.

In this exemplary embodiment, since the optical device 10 is constituted such that the light density in the incident terminal face 16A of the transparent member 16 becomes 8 $W/mm^2$ or less, the reduction of light output caused by contamination may be suppressed.

Further, since the optical device 10 is constituted such that light density of the abutment faces 20 between the transparent member 16 and the optical fiber 18 formed with the junction-inhibiting film 17 becomes 4464 $W/mm^2$ or less, the reduction in light output caused by fusion may be suppressed.

In this exemplary embodiment, the present invention applied to the optical device 10 having such a structure that laser light from the laser light source 12 enters the optical fiber 18 through the lens 14 and the transparent member 16 is explained. However, the present invention is not limited to this, and the present invention may also be applied to laser light which enters the optical fiber 18 is output toward the transparent member 16, i.e., a case in which the transparent member 16 and the optical fiber 18 formed with the junction-inhibiting film 17 are used as output portion of the laser light. The present invention may also be applied to a bundle fiber including a plurality of output portions tied in a bundle.

Although the junction-inhibiting film 17 is formed in the terminal face of the optical fiber 18 on the side of the abutment face is explained in this exemplary embodiment, the present invention is not limited to this. The junction-inhibiting film 17 may be formed on the terminal face of the transparent member 16 on the side of the abutment face. Further, the junction-inhibiting film 17 may be formed on terminal faces of both the optical fiber 18 and the transparent member 16 on the side of the abutment faces thereof.

The transparent member 16 may be composed of a plurality of members. In this case, the light density of the incident terminal face of one of a plurality of members into which laser light enters is set to 8 $W/mm^2$ or less, thereby suppressing the reduction of light output caused by contamination. When the junction-inhibiting films are formed on abutment faces of a plurality of members, if the light densities of the abutment faces are set to 4464 $W/mm^2$ or less, a reduction in light output caused by fusion may be suppressed.

The optical device 10 may be used for an exposure apparatus having an exposure light source, e.g., an exposure apparatus for exposure for forming a wire of a printed board.

Second Exemplary Embodiment

Next, a second exemplary embodiment of the present invention will be explained. The same portion as those in the first exemplary embodiment will be designated with the same numerals and detailed explanation thereof will be omitted.

Figure 4:
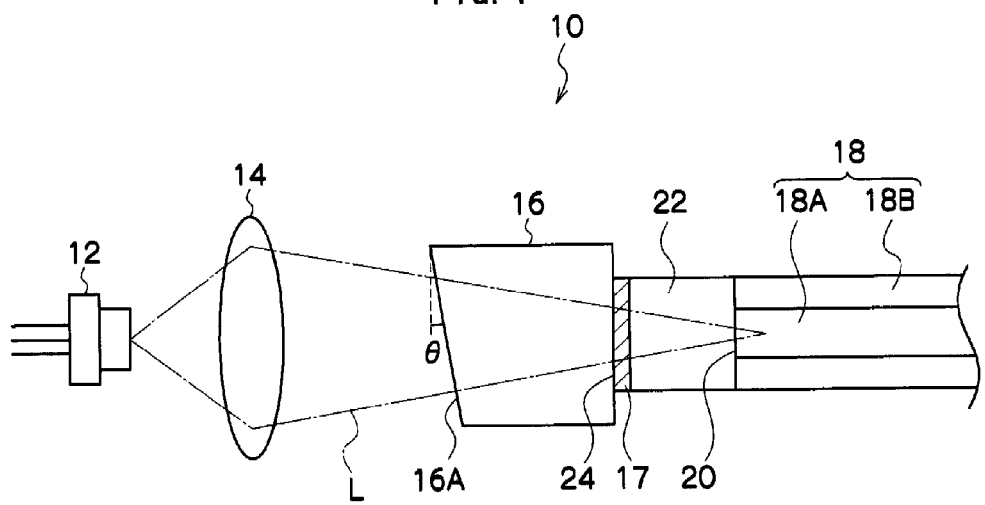
FIG. 4 is a schematic diagram of an optical device according to a second exemplary embodiment.

FIG. 4 is a schematic diagram of a structure of an optical device 10A of the exemplary embodiment. As shown in FIG. 4, the optical device 10A is different from the optical device 10 shown in FIG. 1 in that the optical device 10A is provided with a second transparent member 22 having the same outer diameter as that of the optical fiber 18 between the transparent member 16 and the optical fiber 18, and the junction-inhibiting film 17 is formed on the terminal face of the second transparent member 22 on the side of the abutment face with respect to the transparent member 16.

Figure 5:
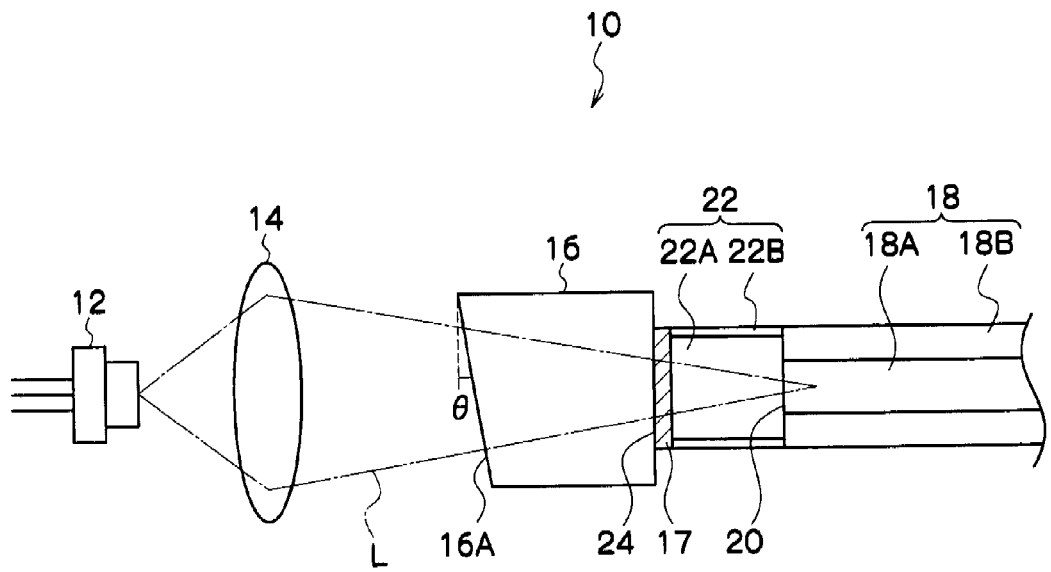
FIG. 5 is a schematic diagram of a modification of the optical device according to the second exemplary embodiment.

The second transparent member 22 has the outer diameter greater than a beam diameter of the laser light L which passes through the second transparent member 22 so that the laser light L is not vignetted. The second transparent member 22 may be glass stab made of quartz for example. The second transparent member 22 may be made of coreless fiber, or may be a fiber stab made of optical fiber including a core 22A and a clad 22B having core diameters greater than the beam diameter of the laser light L which passes as shown in FIG. 5.

Abutment faces 24 between the transparent member 16 and the second transparent member 22 formed with the junction-inhibiting film 17 are in optical contact with each other, and the abutment faces 20 between the second transparent member 22 and the optical fiber 18 are fused spliced to each other.

In the case of this structure also, if the optical device 10 is constituted such that the light density of the incident terminal face 16A of the transparent member 16 becomes 8 W/mm² or less, the reduction in light output caused by contamination may be suppressed.

If the optical device 10 is constituted such that the light density of the abutment faces 24 between the transparent member 16 and the second transparent member 22 formed with the junction-inhibiting film 17 becomes 4464 W/mm² or less, the reduction in light output caused by fusion may be suppressed.

In this exemplary embodiment, the second transparent member 22 formed with the junction-inhibiting film 17 is provided between the transparent member 16 and the optical fiber 18. Therefore, as compared with the optical device 10 shown in FIG. 1, the light density of the incident terminal face 16A of the transparent member 16 may be reduced, and the light density of the abutment faces 24 between the transparent member 16 and the second transparent member 22 formed with the junction-inhibiting film 17 may be reduced, and the reduction in light output caused by contamination and fusion may be suppressed.

The transparent member 16 may be composed of a plurality of transparent members. In this case also, if the optical device 10 is constituted such that the light density of the incident terminal face of a transparent member which is exposed to air, i.e., of a transparent member closest to the lens 14 becomes 8 W/mm² or less, the reduction of light output caused by contamination may be suppressed. If the optical device 10 is constituted such that the light density of the abutment faces of the transparent members becomes 4464 W/mm² or less, the reduction in light output caused by fusion may be suppressed.

In this exemplary embodiment, the junction-inhibiting film 17 is formed on the terminal face of the second transparent member 22 on the side of the abutment face with respect to the transparent member 16. However, the present invention is not limited to this, and the junction-inhibiting film 17 may be formed on the terminal face of the second transparent member 22 on the side of the abutment face with respect to the optical fiber 18. The junction-inhibiting films 17 may be formed on the side of the transparent member 16 and on the side of the optical fiber 18.

In this exemplary embodiment also, like the first exemplary embodiment, the present invention may be applied to a structure in which laser light which enters the optical fiber 18 is output to the second transparent member 22 and the transparent member 16, i.e., when the transparent member 16, the second transparent member 22 and the optical fiber 18 are used as output portions of laser light. The present invention may also be applied to a bundle fiber including a plurality of output portions tied in a bundle.

Figure 6:
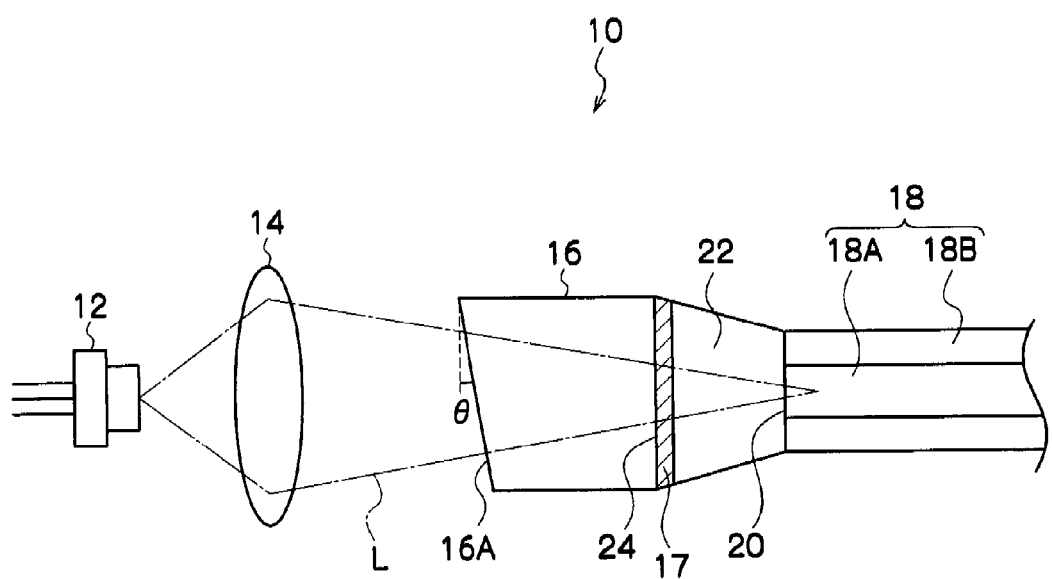
FIG. 6 is a schematic diagram of another modification of the optical device according to the second exemplary embodiment.

In the exemplary embodiment, the second transparent member 22 has the same outer diameter as that of the optical fiber 18. However, the present invention is not limited to this; the second transparent member 22 may have an outer diameter greater than that of the optical fiber 18. Further, as shown in FIG. 6, the second transparent member 22 may be a tapered member having the same outer diameter as the outer diameter of the optical fiber 18 at the abutment face 20 with the optical fiber 18, the outer diameter of the second transparent member 22 increasing toward the transparent member 16 side.

A plurality of fiber stabs, coreless fiber or quartz stabs having different diameters may be fused spliced to each other to form the second transparent member 22. In this case, if the second transparent member 22 is constituted such that the diameter is gradually increased in stages from the optical fiber 18, a surface area of the abutment face 24 between the second transparent member 22 and the transparent member 16 may be increased, and the opening may be increased.

Next, an exemplary embodiment of the present invention will be explained.

First Embodiment

A semiconductor laser having a currently available wavelength of 370 nm to 500 nm, a lens which condenses laser light output from the semiconductor laser at a magnification of four times on the side of an optical fiber, and a transparent member made of quartz and integrally formed with a sleeve so that the optical fiber may be connected at the condensing point, were disposed, and a receptacle optical device allowing the optical fiber to be pulled out from the sleeve was prepared.

A junction-inhibiting film made of $MgF_2$ and having a thickness of $\lambda/12$ ($\lambda$ being the wavelength of laser light) was formed on the incident side of the optical fiber by an ion assist method (IAD method). This optical fiber was inserted into the sleeve and abutted against the transparent member (optical contact), light was allowed to enter the fiber, and deficiencies caused by contamination and fusion were examined.

In the case of the receptacle type optical device, a deficiency is generated on abutment faces between the transparent member 16 and the optical fiber 18 at which is formed the junction-inhibiting film 17. The abutment face is shifted in the main axial direction of the laser light by an amount of the length of the junction-inhibiting film, as compared with a case where the junction-inhibiting film is not provided. Therefore, light density at the abutment face may be reduced. Thus, a reliable receptacle type optical device using a higher output light source may be produced.

The optical device was designed such that the light density of the abutment faces between the transparent member and the optical fiber was 4464 W/mm² or less and the light density in the incident terminal face of the transparent member was 8 W/mm² or less.

More specifically, the output P (W) beam area S1 of the semiconductor laser may satisfy the above formula (2). However, if the beam shape is elliptic, the beam area S1 Π may be expressed by $(r1 \times r2 \times \Pi)$ wherein r1 represents a long axis radius and r2 represents a short axis radius. In the following formulas, a radiation half angle of the laser light which is output from the semiconductor laser in the vertical direction is indicated by $NA_\perp$, a radiation half angle in the horizontal direction is indicated by $NA_{//}$, a length of the laser light of the transparent member in the main axial direction is indicated by $L_{stab}$, a refractive index of the transparent member is indicated by $n_{stab}$, a magnification of the lens is indicated by $\alpha$, the long axis radius is indicated by r1, and the short axis radius by r2.

$$r1 = L_{stab} \times NA_\perp / n_{stab} \times 1/\alpha \quad (4)$$

$$r2 = L_{stab} \times NA_{//} / n_{stab} \times 1/\alpha \quad (5)$$

Therefore, if the length $L_{stab}$ of the transparent member is set such that the following formula is satisfied, the reduction in light output caused by contamination may be suppressed.

$$P \leq 8 \times L_{stab} \times NA_\perp / n_{stab} \times 1/\alpha \times L_{stab} \times NA_{//} / n_{stab} \times 1/\alpha \times \Pi \quad (6)$$

Similarly, it is assumed that the beam shape is elliptic, a long axis radius is represented by r3 and a short axis radius is represented by r4, the beam area S2 may be expressed by (r3×r4×Π). The long axis radius r3 and the short axis radius r4 may be expressed by the following formulas.

$$r3 = NA_\perp / n_{stab} \times 1/\alpha \quad (7)$$

$$r4 = NA_{//} / n_{stab} \times 1/\alpha \quad (8)$$

Therefore, if the following formula is satisfied, the reduction in light output caused by fusion may be suppressed.

$$P \leq 4464 \times NA_\perp / n_{stab} \times 1/\alpha \times NA_{//} / n_{stab} \times 1/\alpha \times \Pi \quad (9)$$

Further, if the diameter φstab of the transparent member is set such that all of the following formulas are satisfied, beam is not vignetted.

$$\phi stab < r1 \times 2 \quad (10)$$

$$\phi stab < r2 \times 2 \quad (11)$$

Further, if the diameter φcf of the transparent member is set such that all of the following formulas are satisfied, beam is not vignetted.

$$\phi cf < r3 \times 2 \quad (12)$$

$$\phi cf < r4 \times 2 \quad (13)$$

An area S of a light-emitting shape of the terminal face of the semiconductor laser in the produced optical device was 7×1 μm², the radiation angle $\theta_\perp$ in the vertical direction was 42°, the radiation angle $\theta_{//}$ in the horizontal direction was 16°, and the output P of the laser light was 500 mW. An energization test was carried out such that light density in the abutment faces of the transparent member and the optical fiber became 4464 W/mm² in this structure, fusion in the abutment face was not generated.

When the length $L_{stab}$ of the transparent member was set to 2.9 mm, contamination was generated at the incident terminal face of the laser light of the transparent member when the output P was 340 mW or more, and the light output was reduced. Hence, the length $L_{stab}$ of the transparent member was again set such that the formula (6) was satisfied. More specifically, $NA_\perp=0.383$, $NA_{//}=0.141$, $n_{stab}=1.46$ and P=500 mW. Therefore, when a transparent member having $L_{stab}$ of 4.0 mm or higher and a diameter of 530 μm or higher was used, it was possible to produce a light source in which deterioration caused by contamination was so small that it could be ignored.

Second Embodiment

A semiconductor laser having a currently available wavelength of 370 nm to 500 nm, a lens which condenses laser light which was output from the semiconductor laser with magnification of four times on the side of the optical fiber, and a transparent member made of quartz which was integrally formed with a sleeve so that the optical fiber could be connected at the condensing point, were disposed, and a receptacle optical device from in which the optical fiber could be pulled out from the sleeve was prepared.

The transparent member and a coreless fiber having the same outer diameter as that of the optical fiber were fused and spliced at the incident side of the optical fiber, and the coreless fiber (corresponding to the second transparent member) was cut near a desired length, and these were polished, thereby obtaining a fiber having a desired coreless fiber length. A junction-inhibiting film made of $MgF_2$ and having a thickness of λ/12 (λ being a wavelength of laser light) was formed on the terminal face of this fiber by an ion assist method (IAD method). This optical fiber was inserted into the sleeve and abutted against the transparent member (optical contact); light was allowed to enter the fiber and deficiencies caused by contamination and fusion were examined.

In the case of the receptacle type optical device, since the splice faces between the coreless fiber and the optical fiber are fused spliced with each other, a deficiency caused by fusion is not generated, and such a deficiency is generated between the abutment faces between the transparent member 16 and the coreless fiber. As compared with a case where the coreless fiber is not provided, since the abutment face is shifted in the main axial direction of the laser light by the length of the coreless fiber, the light density in the abutment face may be reduced. Thus, a reliable receptacle type optical device using higher output light source may be produced.

The optical device was designed such that the light density in the abutment faces between the transparent member and the coreless fiber became 4464 W/mm² or less and the light density in the incident terminal face of the transparent member became 8 W/mm² or less.

More specifically, the output P [W] beam area S1 of the semiconductor laser may satisfy the formula (2). However, if the beam shape is elliptic, the beam area S1 is expressed with (r1×r2×Π) wherein a long axis radius is represented by r1 and a short axis radius is represented by r2. Here, a radiation half angle of the laser light which is output from the semiconductor laser in the vertical direction is represented by $NA_\perp$, a radiation half angle in the horizontal direction is represented by $NA_{//}$, a length of the laser light of the transparent member in the main axial direction is represented by $L_{stab}$, refractive index of the transparent member is represented by $n_{stab}$, a length of laser light of the coreless fiber in the main axial direction is represented by $L_{cf}$ and magnification of the lens is represented by α, the long axis radius r1 and the short axis radius r2 may be expressed in the following formulas.

$$r1 = (L_{stab} + L_{cf}) \times NA_\perp / n_{stab} \times 1/\alpha \quad (14)$$

$$r2 = (L_{stab} + L_{cf}) \times NA_{//} / n_{stab} \times 1/\alpha \quad (15)$$

Therefore, if the length $L_{stab}$ of the transparent member and the length $L_{cf}$ of the coreless fiber are set such that the following formula is satisfied, the reduction in light output caused by contamination may be suppressed.

$$P \leq 8 \times (L_{stab} + L_{cf}) \times NA_\perp / n_{stab} \times 1/\alpha \times (L_{stab} + L_{cf}) \times NA_{//} / n_{stab} \times 1/\alpha \times \Pi \quad (16)$$

Similarly, it is assumed that the beam shape is elliptic, a long axis radius is represented by r3 and a short axis radius is represented by r4, the beam area S2 may be expressed by (r3×r4×Π). The long axis radius r3 and the short axis radius r4 may be expressed by the following formulas.

$$r3 = L_{cf} \times NA_\perp / n_{stab} \times 1/\alpha \quad (17)$$

$$r4 = L_{cf} \times NA_{//} / n_{stab} \times 1/\alpha \quad (18)$$

Therefore, if the length $L_{stab}$ of the transparent member and the length $L_{cf}$ of the coreless fiber are set such that the following formula is satisfied, the reduction in light output caused by fusion may be suppressed.

$$P \leq 4464 \times NA_\perp / n_{stab} \times 1/\alpha \times L_{cf} \times NA_{//} / n_{stab} \times 1/\alpha \times \Pi \quad (19)$$

Further, if the diameter φstab of the transparent member is set such that all of the following formulas are satisfied, beam is not vignetted.

$$\phi stab < r1 \times 2 \quad (20)$$

$$\phi stab < r2 \times 2 \quad (21)$$

Further, if the diameter φcf of the transparent member is set such that all of the following formulas are satisfied, beam is not vignetted.

$$\phi cf < r3 \times 2 \quad (22)$$

$$\phi cf < r4 \times 2 \quad (23)$$

An area S of a light-emitting shape of the terminal face of the semiconductor laser in the produced optical device was $7 \times 1$ μm$^2$, the radiation angle $\theta_\perp$ in the vertical direction was 42°, the radiation angle $\theta_{//}$ in the horizontal direction was 16°, and the output P of the laser light was 500 mW. In this structure, the length $L_{cf}$ of the coreless fiber was set to 0.5 mm and the length $L_{stab}$ of the transparent member was set to 7.0 mm. The light density of the abutment faces of the transparent member and the coreless fiber, i.e., the light density of the junction-inhibiting film was 402 W/mm$^2$, and it was confirmed that a deficiency was not generated by fusion.

In this structure, the upper limit value of the light output of the laser light which may suppress the deterioration of the fusion mode is obtained. The beam diameter becomes maximum when the fiber diameter of the coreless fiber is 125 μm and beams in the Fast direction are emitted uniformly. The coreless fiber length for obtaining this beam diameter is 0.95 mm, and a light output value when the light density becomes 4464 W/mm$^2$ with the terminal face of the coreless fiber is about 20 W. This is the upper limit value of the light output of the laser light capable of suppressing deterioration of the fusion mode.

In the receptacle type optical device, the optical device was constituted such that the outer diameter of the transparent member was set to 125 μm and the light density of the incident terminal face of the transparent member became 8 W/mm$^2$ which is the upper limit value at which contamination was not generated, and the output of the laser light at which contamination was generated in the incident terminal face was measured, and it was about 100 mW. Therefore, in the case of this structure, if the light density of the incident terminal face of the transparent member is set to 8 W/mm$^2$ or less, the output of the laser light may be set to 100 mW or more.

In the receptacle type optical device, the optical device was constituted such that the core diameter of the optical fiber was set to 60 μm and the light density in the abutment faces between the transparent member and the coreless fiber became 4464 W/mm$^2$ which was the upper limit value for not generating the fusion, and the output of the laser light at which fusion was generated in the abutment face was measured and it was about 12 W. Therefore, in the case of this structure, if the light density in the abutment face is 4464 W/mm$^2$ or less, the output of the laser light may be 12 W or more.

In the receptacle type optical device, the optical device was constituted such that the outer diameter of the transparent member was set to 125 μm and the light density in the abutment faces between the transparent member and the coreless fiber became 4464 W/mm$^2$ which was the upper limit value for not generating the fusion, and the output of the laser light at which fusion was generated in the abutment face was measured and it was about 54 W. Therefore, in the case of this structure, if the light density in the abutment face is 4464 W/mm$^2$ or less, the output of the laser light may be 54 W or more.

In the structure of the receptacle type optical device in which the junction-inhibiting film is not provided, the optical device was constituted such that the outer diameter of the transparent member was set to 125 μm and the light density in the abutment faces between the transparent member and the coreless fiber became 140 W/mm$^2$ which was the upper limit value for not generating the fusion, and the output of the laser light at which fusion was generated in the abutment face was measured and it was about 1.7 W. Therefore, in the case of this structure, if the light density in the abutment face is 140 W/mm$^2$ or less, the output of the laser light may be 1.7 W or more.

Similarly, in the structure of the receptacle type optical device in which the junction-inhibiting film is not provided, the optical device was constituted such that the core diameter of the optical fiber was set to 60 μm and the light density in the abutment faces between the transparent member and the coreless fiber became 140 W/mm$^2$ which was the upper limit value for not generating the fusion, and the output of the laser light at which fusion was generated in the abutment face was measured and it was about 400 mW. Therefore, in the case of this structure, if the light density in the abutment face is 140 W/mm$^2$ or less, the output of the laser light may be 400 mW or more.

The same result was obtained when a fiber stab was used instead of the coreless fiber.

Third Embodiment

Next, an embodiment of the junction-inhibiting film will be explained.

The applicant confirmed that if the junction-inhibiting film was a fluoride film having a thickness of less than $\lambda/2$, variation over time of the film quality was small and reduction in light loss when laser light enters for a long time could be suppressed. MgF$_2$ films respectively having thicknesses of $\lambda/2$, $\lambda/4$ and $\lambda/6$ were formed by vapor deposition on terminal faces of optical fibers 18 to prepare three kinds of optical devices 10. FIG. 7 is a graph showing variation over time of light output of output light emitted from the optical fibers 18 when laser light having a light output of 160 mW and wavelength $\lambda$ of 405 nm entered the transparent member 16. In FIG. 7, g1 is a graph of a film thickness of $\lambda/2$, g2 is a graph of a film thickness of $\lambda/4$, and g3 is a graph of a film thickness of $\lambda/6$. The vertical axis shows a ratio of an output value of output light with respect to an output value of incident light, i.e., as the light output shown by the vertical axis decreases, light loss increases. At that time, laser light passes through a region having a diameter of about 30 μm in each film. The condensed position of the laser light is on the junction-inhibiting film.

It may be seen from FIG. 7 that as film thickness decreases, reduction of light output of the output light decreases (i.e., light loss decreases). The junction-inhibiting films after respective experiments were observed by a microscope, and outward variation of the film having the thickness of $\lambda/6$ was hardly seen at all; however, in the films having thicknesses of $\lambda/2$ and $\lambda/4$, color change was found in a region through which it was thought that laser light had passed. In the film having the thickness of $\lambda/2$, a crack was found in the film around the color change portion. It is thought that the color change found in the films having the thicknesses of $\lambda/2$ and $\lambda/4$ was due to films being melted by the heat of the laser light. From these results, it is thought that as the film thickness increases, energy absorption of the laser light caused by film increases, film quality varies due to this absorption, and the light loss increases.

Next, the applicant confirmed that the light loss may be smaller if the film is formed by the ion assist method rather than vapor deposition method. MgF$_2$ films having thickness of $\lambda/6$ were formed on terminal faces of optical fibers 18 by the vapor deposition method and the ion assist method to prepare two kinds of optical devices 10. FIG. 8 is a graph showing variation with time of light output of output light emitted from the optical fibers 18 when laser light of light output of 160 mW and a wavelength λ of 405 nm entered the transparent member 16, wherein g4 represents the vapor deposition method and g5 represents the ion assist method.

It may be seen from FIG. 8 that if the film is formed by the ion assist method, the reduction in light output is slightly smaller compared to the vapor deposition method. Since the inclination of the graph g5 is smaller than the graph g4, it is thought that after 1000 hours or more have elapsed, the difference in light output between the film forming methods will increase (not shown). In the case of the ion assist method, a target (incident end of the optical fiber 18) may be subjected to cleaning processing by an ion beam before film formation. Therefore, it can be assumed that light loss in the interface between the target and the film may be reduced, and light loss may be reduced as compared with the vapor deposition method. By the ion assist method, a film having a more delicate film quality than one formed with the vapor deposition method may be provided. Thus, with the ion assist method, variation in film quality due to energy absorption of laser light is smaller and light loss may be reduced as compared to the vapor deposition method. The target may be cleaned before a film is formed. Examples of a method capable of forming a film having more delicate film quality than the vapor deposition method are an ion plating method and a sputtering method, in addition to the ion assist method.

Figure 9:
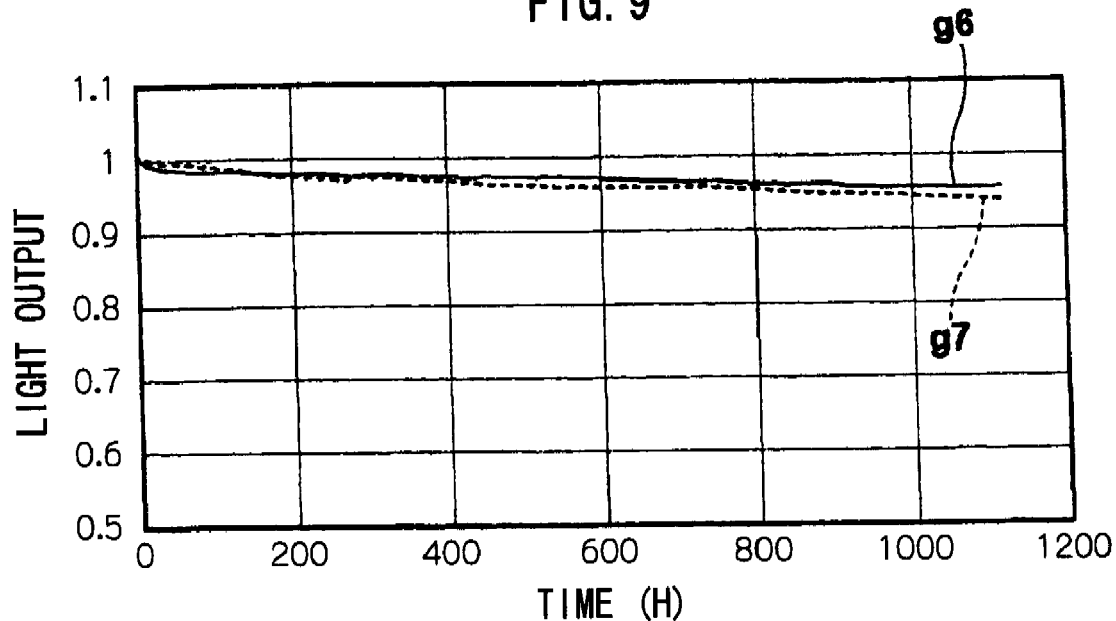
FIG. 9 is a graph showing variation with time of light output of output light when $MgF_2$ films having film thicknesses of $\lambda/6$ and $\lambda/12$ were respectively formed by the ion assist method.

$MgF_2$ films having thicknesses of $\lambda/6$ and $\lambda/12$ were formed on terminal faces of the optical fibers 18 to prepare two kinds of optical devices 10. FIG. 9 is a graph showing variation with time of the light output of output light emitted from the optical fibers 18 when laser light having a light output of 160 mW and a wavelength λ of 405 nm enter the transparent member 16, and g6 shows a graph of film thickness of $\lambda/6$ and g7 shows a graph pf film thickness of $\lambda/12$. It is found from FIG. 9 that the film having the thickness of $\lambda/6$ and the film having the thickness of $\lambda/12$ have substantially the same manner of variation in light output. Thus, if the laser light conditions are the same and light output is 160 mW and λ is 405 nm and the film thickness is $\lambda/6$ or less, time characteristics of the output light are substantially the same.

Figure 10:
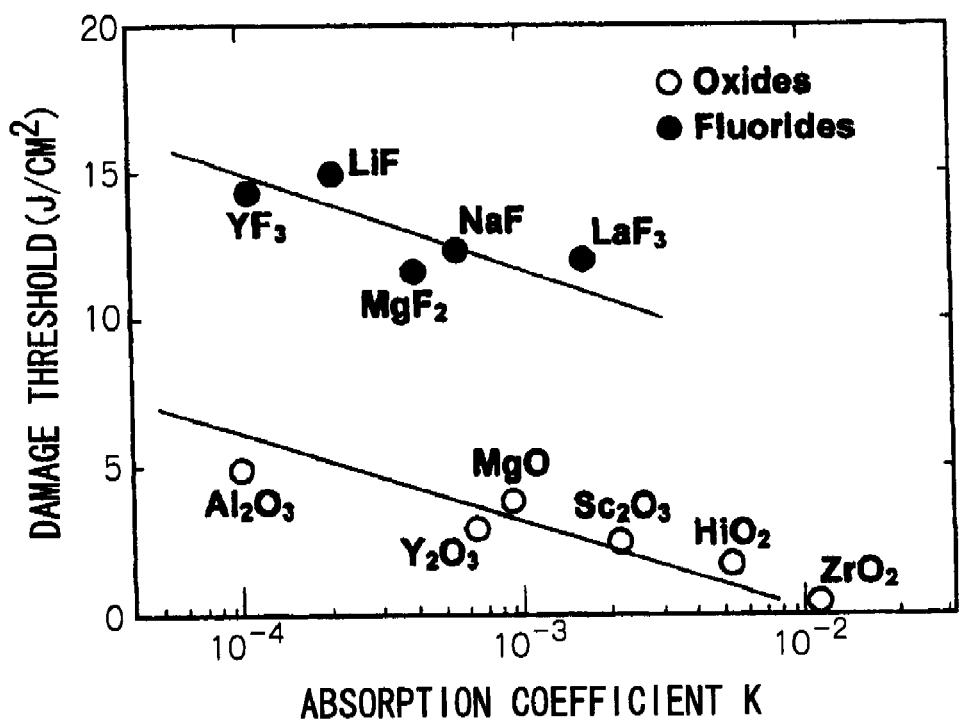
FIG. 10 is a graph showing a relation between an absorption coefficient and a damage threshold value of a film by a pulse laser having wavelength of 248 nm.
Figure 11:
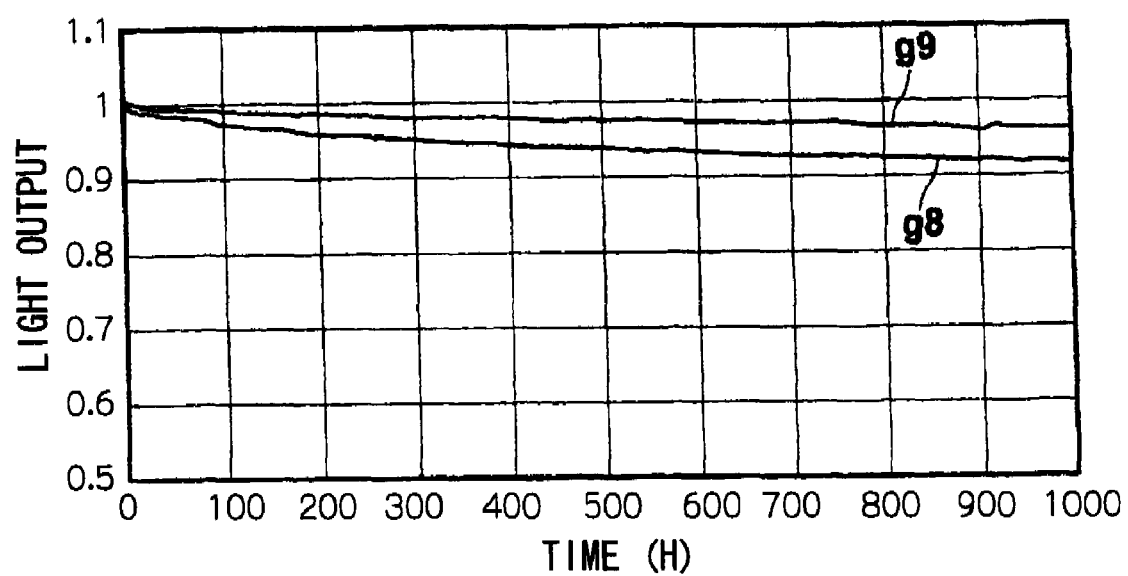
FIG. 11 is a graph showing variation with time of light output of output light when an $MgF_2$ film and a $YF_3$ film having film thickness of $\lambda/6$ were respectively formed by the vapor deposition method.

Next, the applicant confirmed that if a film is made of a material having a low absorption coefficient, light loss could be reduced more efficiently. FIG. 10 is a graph showing the relation between the absorption coefficient of a film in relation to a pulse laser having a wavelength of 248 nm, and damage threshold values (cited from "High damage threshold fluoride UV mirrors made by IonBeam Sputtering", J. Dijion, et., al., SPIE Vol. 3244, pp 406-418, 1998). From this graph, it may be seen that fluoride films have high damage threshold values, and among fluoride films, $YF_3$ and LiF have higher damage threshold values than $MgF_2$. Hence, an $MgF_2$ film and a $YF_3$ film having thicknesses of $\lambda/6$ were formed on terminal faces of optical fibers 18 by the vapor deposition method to prepare two kinds of optical devices 10. Variation over time of light output of light emitted from the optical fibers 18 when laser light having a light output of 160 mW and a wavelength λ of 405 nm entered the transparent member 16 was measured. FIG. 11 shows the results of the measurements. In FIG. 11, g8 is a graph of the $MgF_2$ film and g9 is a graph of the $YF_3$ film. It may be seen from FIG. 11 that light output reduction of the $YF_3$ film is less than that of the $MgF_2$ film. Since the inclination of graph with respect to the $YF_3$ film is slightly smaller than that of the $MgF_2$ film, it is thought that after 1000 hours or more have elapsed, the difference in light output between the film forming methods will have increased (not shown). Thus, to reduce light loss, it is preferable that a fluoride film (e.g., any of $YF_3$, LiF, $MgF_2$, NaF, $LaF_3$, $BaF_2$, $CaF_2$ and $AlF_3$) is used, and it is more preferable to use $YF_3$ which has a low absorption coefficient.

From the above, when laser light of light output of 160 mW and wavelength λ of 405 nm enters the optical fiber 18 for 1000 hours or more, in order to suppress the reduction ratio of the light output of output light after 1000 hours with respect to the light output of output light immediately after the laser light enters to less than 10%, it is desirable that the film thickness of a film to be formed on the incident end of the optical fiber 18 is $\lambda/6$ or less. Desirably, the film forming method capable of cleaning a target before a film is formed and of forming a film having delicate film quality may be used, e.g., the ion assist method, the ion plating method and the sputtering method. It is desirable that the film has small energy absorption of laser light.

If the light density at which fusion is generated in the abutment faces between the optical fiber 18 and the transparent member 16 when a junction-inhibiting film having light output of 160 mW, λ of 405 nm and film thickness of $\lambda/6$ is formed on the optical fiber 18 is calculated in the same manner as that of the first embodiment, the light density becomes about 1600 W/mm². Therefore, in this structure, if the optical device is constituted such that light density in the abutment faces between the optical fiber 18 and the transparent member 16 becomes 1600 W/mm² or less that is the upper limit value not generating fusion, reduction of light output caused by fusion may be suppressed.

When the wavelength of light to be introduced has short wavelength region (160 nm to 500 nm), in order to prevent contamination caused by organic matter, the terminal face of the transparent member 16 on which the junction-inhibiting film 17 is not formed and/or terminal face of the optical fiber 18 may be subjected to UV cleaning. The junction-inhibiting film including the fluoride (any of $YF_3$, LiF, $MgF_2$, NaF, $LaF_3$, $BaF_2$, $CaF_2$ and $AlF_3$) is inert with respect to light in UV region (190 nm~410 nm). Since a junction-inhibiting film 17 made of fluoride is formed on the optical fiber 18, reaction of oxide (quartz, $SiO_2$ or the like) on the abutment portion between the transparent member 16 and the optical fiber 18 may be prevented, and damage of the abutment portion may be suppressed. When a terminal face of the transparent member 16 and/or the terminal face of the optical fiber 18 is subjected to the UV cleaning to prevent contamination caused by organic matter in the structure in which the junction-inhibiting film is formed also on the transparent member 16, the chemical reaction in the abutment portion between the transparent member 16 and the optical fiber 18 can be suppressed.

If the structure of the present invention is employed, a light source having a higher output than that of conventional optical devices may be used. More specifically, assuming the output of the light source is a cross sectional area of the core of the optical fiber×8 W/mm² or greater, in a conventional pigtail type laser in which light is directly input to the core of the optical fiber without passing through a transparent member, contamination is generated at the interface of the fiber terminal face that comes into contact with the outside air, but if the structure of the present invention is employed, the output of the light source is used as the above-described output, and the generation of contamination at the terminal face of the optical member that comes into contact with the outside air may be suppressed.

When the output of the light source is a cross sectional area of the optical fiber×8 W/mm² or more, a contaminant is generated at an interface of the fiber terminal face that comes into contact with the outside air, in an embodiment in which it is directly input into a conventional fiber having a tip end to which a coreless fiber is fused, but if the structure of the present invention is employed, a contaminant may be prevented from being generated on the terminal face of the optical member that comes into contact with the outside air, even if the output of the light source is the above-mentioned output.

When the output of the light output is a cross section of a ferrule×8 W/mm$^2$ or more, a contaminant is generated at an interface of the fiber terminal face that comes into contact with the outside air, in an embodiment in which it is directly input into the conventional optical fiber having a periphery supported by a ferrule, but if the structure of the present invention is employed, a contaminant may be prevented from being generated on the terminal face of the optical member which comes into contact with the outside air even if the output of the light source is the above-mentioned output.

When the output of the light output is a cross section of the optical fiber×140 W/mm$^2$ or more, the fusion problem occurs in an embodiment of the receptacle in which conventional glass stab and fiber abut against each other and used, but if the structure of the present invention is employed, the fusion may be suppressed and the high output light source may be used even if output of the light source is the above-mentioned output.

When the output of the light output is a cross section of the optical fiber×140 W/mm$^2$ or more, the fusion problem occurs in an embodiment of the receptacle in which optical fiber to which coreless fiber or fiber stab is merely fused is abutted against the glass stab and used, but if the structure of the present invention is employed, the fusion may be suppressed and to use the high output light source even if output of the light source is the above-mentioned output.

When the output of the light source is a cross section of ferrule×140 W/mm$^2$ or more, the fusion problem occurs in an embodiment of the receptacle in which conventional glass stab and fiber whose periphery is held by ferrule abut against each other and used, but if the structure of the present invention is employed, the fusion may be suppressed and the high output of light source may be used even if output of the light source is the above-mentioned output.

When the output of the light source is a cross section of the optical fiber×4464 W/mm$^2$ or more, the fusion problem occurs in an embodiment of the receptacle in which optical fiber to which coreless fiber or fiber stab is merely fused is abutted against the glass stab and used, but if the junction-inhibiting film described in the present invention is provided at least on the abutment face (face which comes into optically contact), the fusion may be suppressed and the high output light source may be used even if output of the light source is the above-mentioned output.

When the output of the light source is a cross section of the optical fiber×4464 W/mm$^2$ or more, the fusion problem occurs in an embodiment of the receptacle in which conventional glass stab and fiber abut against each other and used, but if the junction-inhibiting film described in the present invention is provided at least on the abutment face (face which comes into optically contact), the fusion may be suppressed and the high output of light source may be used even if output of the light source is the above-mentioned output.

When the output of the light output is a cross section of ferrule×4464 W/mm$^2$ or more, the fusion problem occurs in an embodiment of the receptacle in which conventional glass stab and fiber whose periphery is held by ferrule abut against each other and used, but if the junction-inhibiting film described in the present invention is provided at least on the abutment face (face which comes into optically contact), the fusion may be suppressed and the high output light source may be used even if output of the light source is the above-mentioned output.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optical device comprising:
   a light source which outputs light of a predetermined wavelength;
   a first optical member through which the light of the predetermined wavelength passes; and
   a second optical member which abuts against the first optical member and through which the light of the predetermined wavelength passes; wherein
   the predetermined wavelength is from approximately 160 to approximately 500 nm, a junction-inhibiting film is provided on an abutment face between the first optical member and the second optical member, and a light density in the abutment face is approximately 4464 W/mm$^2$ or less.

2. The optical device of claim 1, wherein the light source is a gallium light source and only outputs light in the range of 500 nm or less.

3. The optical device of claim 1, further comprising a lens disposed between the light source and the first optical member, wherein an output amount of the light source, a magnification of the lens, length the first optical member in a main optical direction, a refractive index of the first optical member are inter-relatedly adjusted to form the light density in the abutment face of 4464 W/mm$^2$ or less.

4. The optical device according to claim 1, wherein the light density in the abutment face is approximately 1600 W/mm$^2$ or less.

5. The optical device according to claim 4, wherein a thickness of the junction-inhibiting film is approximately ⅙ or less of the wavelength of the light of the predetermined wavelength.

6. The optical device according to claim 1, wherein a thickness of the junction-inhibiting film is approximately 1/12 or less of the wavelength of the light of the predetermined wavelength.

7. The optical device according to claim 1, wherein a light density of a terminal face of the first optical member or the second optical member, which the light enters or from which the light is emitted, and which is exposed to the air, is approximately 8 W/mm$^2$ or less.

8. The optical device according to claim 1, wherein the second optical member includes an optical fiber and a third optical member provided between the optical fiber and the first optical member, and the optical fiber and the third optical member are fused and spliced to each other.

9. The optical device according to claim 1, wherein at least one of the first optical member and the second optical member is composed of a plurality of members, and a light density in a second abutment face between the plurality of members is approximately 140 W/mm² or less.

10. The optical device according to claim 1, wherein at least one of the first optical member and second optical member is composed of a plurality of members, and the junction-inhibiting film is provided on an abutment face of the plurality of members that has a light density of from approximately 140 W/mm² to approximately 4464 W/mm².

11. The optical device according to claim 1, wherein a condensed position of the light is a position other than in the abutment face.

12. The optical device according to claim 1, wherein the first optical member and the second optical member have diameters greater than a beam diameter of the light which passes therethrough.

13. The optical device according to claim 1, wherein a terminal face of one of the first optical member or second optical member into which the light enters and which is exposed to the air, is inclined in a direction perpendicular to a main axis of the light of the predetermined wavelength.

14. The optical device according to claim 1, wherein at least one of the first optical member and second optical member includes quartz.

15. The optical device according to claim 7, wherein at least one of the first optical member and second optical member is an optical fiber, and the output of the light of the predetermined wavelength is a cross sectional area of a core of the optical fiber×8 W/mm² or more.

16. The optical device according to claim 7, wherein at least one of the first optical member and second optical member is an optical fiber, and the output of the light of the predetermined wavelength is a cross sectional area of the optical fiber×8 W/mm² or more.

17. The optical device according to claim 7, wherein at least one of the first optical member and second optical member is an optical fiber, and the output of the light of the predetermined wavelength is a cross sectional area of a ferrule which holds the optical fiber×8 W/mm² or more.

18. The optical device according to claim 1, wherein at least one of the first optical member and second optical member is an optical fiber, and the output of the light of the predetermined wavelength is a cross sectional area of a core of the optical fiber×4464 W/mm² or more.

19. The optical device according to claim 1, wherein at least one of the first optical member and second optical member is an optical fiber, and the output of the light of the predetermined wavelength is a cross sectional area of the optical fiber×4464 W/mm² or more.

20. The optical device according to claim 1, wherein at least one of the first optical member and second optical member is an optical fiber, and the output of the light of the predetermined wavelength is a cross sectional area of a ferrule which holds the optical fiber×4464 W/mm² or more.

21. The optical device according to claim 9, wherein at least one of the plurality of members is an optical fiber, and the output of the light of the predetermined wavelength is a cross sectional area of a core of the optical fiber×140 W/mm² or more.

22. The optical device according to claim 9, wherein at least one of the plurality of members is an optical fiber, and the output of the light of the predetermined wavelength is a cross sectional area of the optical fiber×140 W/mm² or more.

23. The optical device according to claim 9, wherein at least one of the plurality of members is an optical fiber, and the output of the light of the predetermined wavelength is a cross sectional area of a ferrule which holds the optical fiber×140 W/mm² or more.

24. The optical device according to claim 1, wherein the predetermined wavelength is approximately from 370 to approximately 500 nm.

25. The optical device according to claim 1, wherein the junction-inhibiting film is formed by an ion assist method.

26. The optical device according to claim 1, wherein the junction-inhibiting film includes fluoride.

27. An exposure apparatus having an optical device, the optical device comprising:
    a light source which outputs light of predetermined wavelength;
    a first optical member through which the light of the predetermined wavelength passes; and
    a second optical member which abuts the first optical member and through which the light of the predetermined wavelength passes, wherein
        the predetermined wavelength is from approximately 160 to approximately 500 nm, a junction-inhibiting film is provided on an abutment face between the first optical member and the second optical member, and a light density in the abutment face is approximately 4464 W/mm² or less.

* * * * *